United States Patent
Schwarzl et al.

(10) Patent No.: US 8,076,055 B2
(45) Date of Patent: *Dec. 13, 2011

(54) PASSIVATION OF MULTI-LAYER MIRROR FOR EXTREME ULTRAVIOLET LITHOGRAPHY

(75) Inventors: Siegfried Schwarzl, Neubiberg (DE); Stefan Wurm, Austin, TX (US)

(73) Assignee: Infineon Technologies AG, Munich (DE)

( * ) Notice: Subject to any disclaimer, the term of this patent is extended or adjusted under 35 U.S.C. 154(b) by 20 days.

This patent is subject to a terminal disclaimer.

(21) Appl. No.: 12/692,243

(22) Filed: Jan. 22, 2010

(65) Prior Publication Data

US 2010/0119981 A1   May 13, 2010

Related U.S. Application Data

(60) Division of application No. 12/624,263, filed on Nov. 23, 2009, now Pat. No. 7,859,648, which is a continuation of application No. 10/901,627, filed on Jul. 28, 2004, now abandoned.

(51) Int. Cl.
G03F 7/20 (2006.01)
(52) U.S. Cl. .......................... 430/311; 355/77
(58) Field of Classification Search .................. None
See application file for complete search history.

(56) References Cited

U.S. PATENT DOCUMENTS

| | | | |
|---|---|---|---|
| 5,958,605 A | 9/1999 | Montcalm et al. | |
| 6,228,512 B1 | 5/2001 | Bajt et al. | |
| 6,290,180 B1 | 9/2001 | Browall et al. | |
| 6,627,362 B2 | 9/2003 | Stivers et al. | |
| 6,656,575 B2 | 12/2003 | Bijkerk et al. | |
| 6,753,946 B2 | 6/2004 | Mulkens et al. | |
| 6,759,141 B2 | 7/2004 | Prisbrey | |
| 7,078,134 B2 | 7/2006 | Wurm et al. | |
| 7,172,788 B2 | 2/2007 | Yakshin et al. | |
| 7,859,648 B2 * | 12/2010 | Schwarzl et al. | 355/67 |
| 2003/0147058 A1 | 8/2003 | Murakami et al. | |
| 2005/0276988 A1 | 12/2005 | Trenkler | |

FOREIGN PATENT DOCUMENTS

| | | |
|---|---|---|
| CN | 1292431 A | 4/2001 |
| DE | 102 58 709 A1 | 7/2004 |
| EP | 1 150 139 A2 | 10/2001 |

(Continued)

OTHER PUBLICATIONS

Braun, A., "ALD Breaks Materials, Conformality Barriers," Semiconductor International (Oct. 2001) pp. 52-54, 56 and 59.

(Continued)

*Primary Examiner* — John A. McPherson
(74) *Attorney, Agent, or Firm* — Slater & Matsil, L.L.P.

(57) ABSTRACT

A reflector structure suitable for extreme ultraviolet lithography (EUVL) is provided. The structure comprises a substrate having a multi-layer reflector. A capping layer is formed over the multi-layer reflector to prevent oxidation. In an embodiment, the capping layer is formed of an inert oxide, such as $Al_2O_3$, $HfO_2$, $ZrO_2$, $Ta_2O_5$, $Y_2O_3$-stabilized $ZrO_2$, or the like. The capping layer may be formed by reactive sputtering in an oxygen environment, by non-reactive sputtering wherein the materials are sputtered directly from the respective oxide targets, by non-reactive sputtering of the metallic layer followed by full or partial oxidation (e.g., by natural oxidation, by oxidation in oxygen-containing plasmas, by oxidation in ozone ($O_3$), or the like), by atomic level deposition (e.g., ALCVD), or the like.

9 Claims, 2 Drawing Sheets

FOREIGN PATENT DOCUMENTS

| | | |
|---|---|---|
| EP | 1 394 815 A1 | 3/2004 |
| GB | 2 355 727 A | 5/2001 |
| WO | WO 03/032329 A1 | 4/2003 |
| WO | WO 2004/053540 A1 | 6/2004 |

OTHER PUBLICATIONS

Dietze, W., et al., "Landolt-Börnstein: Numerical Data and Functional Relationships in Science and Technology," New Series, vol. 17, Springer-Verlag Berlin, (1984) pp. 308-316.

He, Y., et al., "Development of Refractory Silicate-Yttria-Stabilized Zirconia Dual-Layer Thermal Barrier Coatings," Journal of Thermal Spray Technology, vol. 9(1), (Mar. 2000) pp. 59-67.

Lee, K.-I, et al., "Characteristics of the Aluminum Thin Films for the Prevention of Copper Oxidation," J. of the Korean Inst. of Telematics and Electronics, vol. 31A, No. 10 (1994) pp. 108-113, (English abstract).

Meiling, H., et al., "Progress of the EUVL Alpha Tool," Proceedings of SPIE, vol. 4343 (2001) pp. 38-50.

Tichenor, D. A., et al., "System Integration and Performance of the EUV Engineering Test Stand," Proceedings of SPIE, vol. 4343 (2001) pp. 19-37.

Zalar, A., et al., "Interfacial Reactions in $Al_2O_3$/Ti, $Al_2O_3$/$Ti_3Al$ and $Al_2O_3$/TiAl Bilayers," Thin Solid Films, vol. 352 (1999) pp. 151-155.

\* cited by examiner

PASSIVATION OF MULTI-LAYER MIRROR FOR EXTREME ULTRAVIOLET LITHOGRAPHY

This application is a divisional of U.S. application Ser. No. 12/624,263, filed on Nov. 23, 2009 now U.S. Pat. No. 7,859,648, entitled "Passivation of Multi-Layer Mirror for Extreme Ultraviolet Lithography," which is a continuation of U.S. application Ser. No. 10/901,627, entitled "Passivation of Multi-Layer Mirror for Extreme Ultraviolet Lithography," filed on Jul. 28, 2004 now abandoned, both of which are incorporated by reference.

TECHNICAL FIELD

The present invention relates generally to semiconductor fabrication, and more particularly to EUV lithography.

BACKGROUND

Generally, photolithography techniques used in the fabrication of semiconductor devices utilize an imaging system that directs radiation onto a mask to form a pattern. The pattern is projected onto a semiconductor wafer covered with light-sensitive photoresist. Once exposed, the photoresist material may be developed to remove excess photoresist material. The remaining photoresist material acts as an etching mask for an etching process used to pattern the underlying semiconductor wafer.

Ongoing improvements in lithography have allowed the size of semiconductor integrated circuits (ICs) to be reduced, thereby allowing devices with higher density and better performance. One highly promising lithography system uses radiation in the extreme ultraviolet (EUV) wavelength range. Generally, EUV lithography (EUVL) uses radiation having wavelengths of about 10 to 15 nm located between the soft x-ray and the vacuum ultra-violet (VUV) wavelength range.

Generally, EUVL imaging systems are reflective systems. EUV reflective systems, which may be used as an illuminator, projection optics, reflective optics, condenser optics, reflective photo masks, or the like, use multi-layer, thin-film coatings known as distributed Bragg reflectors. The multi-layer coatings typically comprise 40-70, or more, Mo/Si bi-layers with the bi-layer thickness being about half of the respective EUV wavelength being used.

During use, however, the surface of the EUV reflective optics including reflective masks which are also considered to be optical elements frequently become contaminated. Surface oxidation and carbon deposits are particularly troublesome and can shorten the useful life of the EUV reflective optics such that the use of EUV reflective optics is not commercially feasible. Carbon deposits occur due to the absorption of CH-containing molecules (hydrocarbons) on the optics surface from residual gases in the vacuum environment or absorption of carbon containing molecules ($CO$, $CO_2$) and subsequent photon- or secondary electron induced dissociation and desorption reactions. Resist outgassing may also lead to carbon deposition on the mirror surfaces through photo-dissociation or through electron-induced dissociation by photon generated secondary electrons of hydrocarbons. Surface oxidation may result from residual water vapor through absorption of water and subsequent photon-induced or secondary electron-induced dissociation of $H_2O$ where the oxygen remains on the surface and the hydrogen desorbs.

Carbon contaminates may be removed reversibly by controlled introduction of oxidizing gases such as $H_2O$. However, the partial pressures of hydrocarbon-containing gases and water vapor pressure must be tightly controlled within a very small process window that prevents oxidation without leaving too much carbon on the surface. The process is further complicated because EUV optics in an EUV exposure tool are exposed to different EUV intensities and the process window may be different for each mirror. Furthermore, during EUV exposures oxidation is enhanced by generation of highly reactive radicals (e.g., O, OH) via dissociation of gas phase molecules by the intense EUV radiation above the mirror surfaces. The generation of radicals may be different for different light intensities and, therefore, for different mirrors.

Attempts have been made to solve this oxidation problem by adding capping layers of silicon, ruthenium, and layers of silicon and ruthenium modified by adding oxygen and/or nitrogen over the surface of the EUV optics. However, it has been found that these capping layers were not oxidation resistant and did not provide an effective barrier layer against diffusion of oxides, e.g., $O_2$, O, OH, or the like, such that the capping layers were penetrated by these molecules and/or atoms which then oxidized the multi-layer stack below the capping layer causing changes of the optical constants and the thicknesses of the individual layers.

Therefore, what is needed is an EUV optics structure that resists contamination by carbon and oxidation.

SUMMARY OF THE INVENTION

These and other problems are generally solved or circumvented, and technical advantages are generally achieved, by preferred embodiments of the present invention which provides an EUV reflective optics structure that may be used, for example, in EUV lithography.

In accordance with an embodiment of the present invention, a reflective device suitable for use in extreme ultraviolet or soft x-ray applications is provided. The reflective device comprises a substrate having a multi-layer reflector. A capping layer is formed over the multi-layer reflector to prevent oxidation. In an embodiment, the capping layer comprises an inert oxide, such as $Al_2O_3$, $HfO_2$, $ZrO_2$, $Ta_2O_5$, $Y_2O_3$-stabilized $ZrO_2$, or the like.

In accordance with another embodiment of the present invention, a method of forming a reflective device suitable for use in extreme ultraviolet or soft x-ray applications is provided. The method includes forming a capping layer over a multi-layer reflector on a substrate. The capping layer may be formed by reactive sputtering in an oxygen environment, by non-reactive sputtering wherein the materials are sputtered directly from the respective oxide targets, by non-reactive sputtering of the metallic layer followed by full or partial oxidation (e.g., by natural oxidation, by oxidation in oxygen-containing plasmas, by oxidation in ozone ($O_3$), or the like), by atomic level deposition (e.g., ALCVD), or the like.

In accordance with yet another embodiment of the present invention, a method of patterning a semiconductor device is provided. The method utilizes an EUVL system having one or more reflective devices, wherein at least one of the reflective devices have a capping layer formed over a multi-layer reflector. The capping layer prevents or reduces the oxidation of the multi-layer reflector during operation.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

Figure 1:
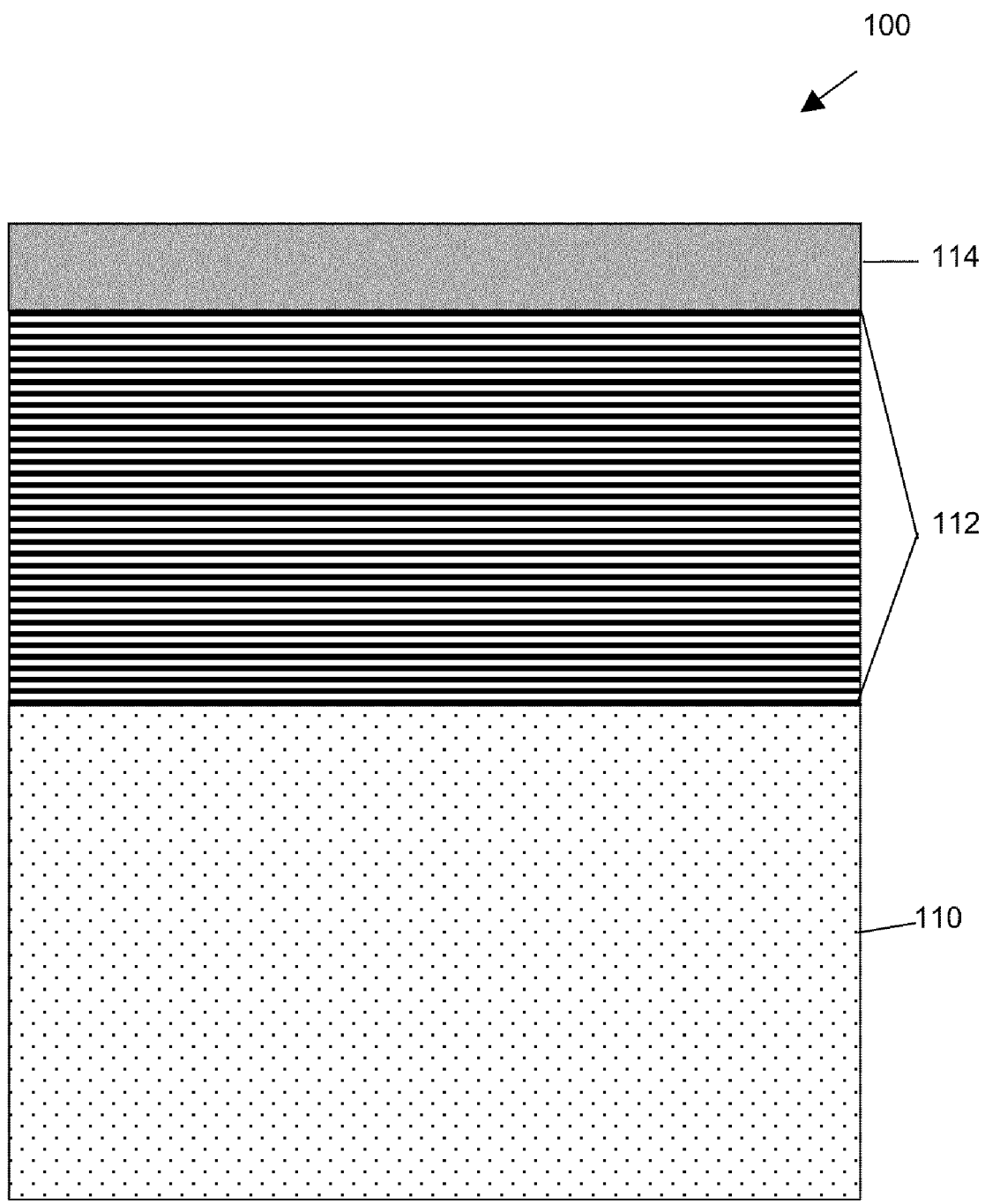
FIG. 1 illustrates an EUV optics structure in accordance with an embodiment of the present invention.

Referring now to FIG. 1, a cross section of an EUV multi-layer reflector 100 is shown in accordance with an embodiment of the present invention. The EUV multi-layer reflector 100 comprises a substrate 110, a multi-layer reflector 112, and a capping layer 114. Preferably, the substrate 110 is formed of a low-thermal expansion material (LTEM) such as ultra-low expansion (ULE) glass available from Corning, Incorporated. Alternatively, other materials, such as Zerodur® manufactured by Schott Glass Technologies or the like, may be used.

The multi-layer reflector 112 comprises alternating layers of a high atomic number Z material and a low atomic number Z material with both materials selected for low absorption index and preferably about 40-70 pairs of alternating layers. In an embodiment, the high atomic number Z material comprises molybdenum, and the low atomic number Z material comprises silicon. In this embodiment, it is preferred that the pair of molybdenum and silicon layers is between about 5 and about 7.5 nm (i.e., about half of the EUV wavelength of about 10-15 nm) in thickness. Thus, the thickness of the multi-layer reflector 112 may be about 200 nm to about 525 nm. In a preferred embodiment in which plasma sources having a wavelength of about 13.5 nm are used, each pair of alternating molybdenum and silicon layers has a thickness of about 6.8 nm. It should be noted that the preferred thickness is dependent upon the angle of incidence of the EUV radiation on the specific multi-layer reflector. Other thicknesses, materials, and number of layers may be used.

The capping layer 114 is preferably formed of one or more thin layers of a material that provide good diffusion barrier properties against oxidation of the underlying multi-layer reflector and allow for effective removal of carbon contaminates. In a preferred embodiment, the capping layer comprises aluminum $Al_2O_3$, about 1 to about 5 nm in thickness, formed by reactive sputtering in an oxygen environment. Suitable methods for forming the cap layer include a DC or AC magnetron sputtering or ion beam deposition. The former is a diode sputtering method in which magnetic fields at the target (cathode) cause intense local plasma densities and thus high sputter rates. In ion beam sputtering deposition systems, ion beams from a separate ion source are obliquely directed to the remote target. Reactive sputtering in either method includes sputtering of a metallic target, in the case of $Al_2O_3$ this is metallic aluminum. Process gases that may be used include argon with an addition of about 10% to about 20% oxygen that reacts with the ejected aluminum atoms from the target surface. It is desirable to have a precise partial pressure control of oxygen to avoid poisoning (oxidation) of the target resulting in large changes of sputter rates. Both types of sputtering systems are preferably comprised of single or multi target systems, UHV design, single substrate processing, and dynamic or static deposition modes. In dynamic systems the substrate is rotated and/or moved along a straight or a curved path (e.g. using a planetary system) to achieve the necessary deposition rate uniformity (<3% (3Sigma). Shaper plates may be used to optimize uniformity. In this manner, the $Al_2O_3$ capping layer has been found to be fabricated using relatively low process temperatures (less than about 200° C.) and yet provides suitable diffusion barrier properties up to about 700° C., a temperature frequently considered beyond the maximum multi-layer reflector temperatures occurring during fabrication of these reflectors or during operation of the EUV exposure tool.

Other inert oxides, such as $HfO_2$, $ZrO_2$, $Ta_2O_5$, $Y_2O_3$-stabilized $ZrO_2$, and the like, may also be used. Other processes, such as non-reactive sputtering wherein the materials are sputtered directly from the respective oxide targets, non-reactive sputtering of the metallic layer followed by full or partial oxidation (e.g., by natural oxidation, by oxidation in oxygen-containing plasmas, by oxidation in ozone ($O_3$), or the like), atomic level deposition (e.g., ALCVD), or the like, may also be used.

It has been found that capping layers formed of these materials provide a low surface roughness less than 0.2 nm and a high thickness uniformity in the order of $10^{-2}$ to $5 \times 10^{-2}$ nm. This creates a highly reflective surface having low aberrations suitable for EUVL technologies and for 50 nm and below designs. One of ordinary skill in the art will also appreciate that the low process temperatures used to form the capping layer prevents or reduces the amount of interdiffusion between the layers of the reflector layer.

It has been found that a EUV reflector formed in this manner allows carbon contaminates to be removed without the problem of oxidation. For example, the carbon contaminates may be removed by introduction of oxidizing gases such as $H_2O$. In the prior art, oxygen from the introduction of the oxidizing gases remain on the EUV reflector surface (penetrating the capping layer, if any) and oxidizes the Bragg reflectors, thereby decreasing performance characteristics. In contrast, embodiments of the present invention prevent or reduce the penetration of atomic and molecular oxygen, thereby protecting the surface of the Bragg reflectors. The capping layer also prevents or reduces the amount of oxidation that may occur on the surface of the capping layer.

Figure 2:
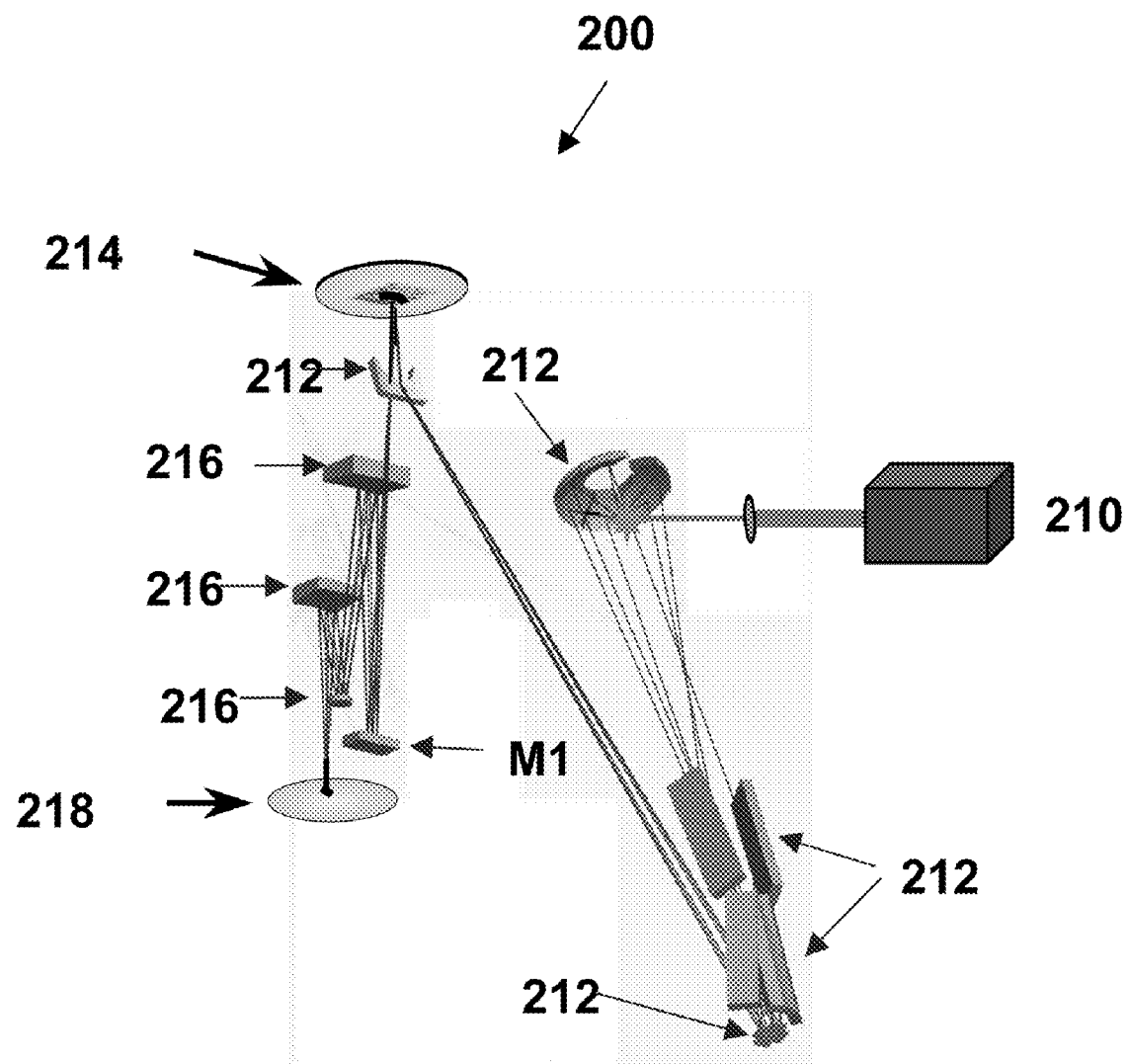
FIG. 2 illustrates an EUVL system in accordance with an embodiment of the present invention.

Referring now to FIG. 2, an EUVL system 200 is shown wherein the optics utilize EUV optics formed in accordance with an embodiment of the present invention. The EUVL system 200 comprises a laser (or other radiation source) 210, condenser mirrors 212, a reflective mask 214, reduction mirrors 216, and a semiconductor wafer 218. Each of the mirrors may include a mirror having a capping layer fabricated in accordance with an embodiment of the present invention. Embodiments of the present invention may be used with other imaging systems and configurations.

In operation, the condenser mirrors 212 collect and focus the radiation generated by the laser 210 onto the reflective mask 214. The reflective mask 214, which is typically scanned, reflects the desired pattern onto the reduction mirrors 216. The reduction mirrors 216 reduce the size of the mask and project the mask having the desired size onto the semiconductor wafer 218. As discussed above, the use of the EUV optics in accordance with an embodiment of the present invention provides a capping layer that provides an oxidation barrier layer that prevents oxidation of the underlying Bragg reflectors, thereby providing better reflectivity and a longer useful life.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning a semiconductor device, the method comprising:
   forming a photoresist material over a semiconductor wafer;
   imaging a light source using a lithographic mirror of a reflective lithographic system to expose the photoresist material through a mask, the lithographic mirror comprising:
      a first substrate formed of a low-thermal expansion material (LTEM);
      a first multi-layer reflector of alternating layers of molybdenum and silicon formed on the first substrate; and
      a first capping layer formed in direct contact onto the first multi-layer reflector, the first capping layer comprising a single layer of an oxide that is chemically inert in an oxidizing environment, said layer of oxide selected from the group consisting of $HfO_2$, $Y_2O_3$-stabilized $ZrO_2$, and combinations thereof;
   removing a portion of the photoresist material corresponding to the portion that was exposed or a portion that was not exposed; and
   modifying the semiconductor wafer where the photoresist material was removed.

2. The method of claim 1, wherein the first substrate comprises ultra-low expansion (ULE) glass.

3. The method of claim 1, wherein each pair of alternating layers of molybdenum and silicon is about 6.8 nm in thickness, and wherein the first capping layer is about 1 nm to about 5 nm in thickness.

4. The method of claim 1, wherein said first substrate has a top surface and said first multi-layer reflector is formed over and in contact with said top surface.

5. The method of claim 1, wherein the lithographic mirror comprises a condenser mirror of the reflective lithography system.

6. The method of claim 5, wherein the light source is imaged using the lithographic mirror and a reduction mirror, the reduction mirror comprising:
   a second substrate formed of a low-thermal expansion material (LTEM);
   a second multi-layer reflector of alternating layers of molybdenum and silicon formed on the second substrate; and
   a second capping layer formed in direct contact onto the second multi-layer reflector, the second capping layer comprising a single layer of an oxide that is chemically inert in an oxidizing environment, said layer of oxide selected from the group consisting of $HfO_2$, $Y_2O_3$-stabilized $ZrO_2$, and combinations thereof.

7. The method of claim 1, wherein the lithographic mirror comprises a reduction mirror of the reflective lithography system.

8. A method of patterning a semiconductor device, the method comprising:
   forming a photoresist material over a semiconductor wafer;
   exposing the photoresist material through a mask in a reflective lithographic system, wherein exposing the photoresist material comprises imaging a light source through a condenser and a reduction mirror, each of the condenser and the reduction mirrors comprising:
      a substrate formed of a low-thermal expansion material (LTEM);
      a multi-layer reflector of alternating layers of molybdenum and silicon formed on the substrate; and
      a capping layer formed in direct contact onto the multi-layer reflector, the capping layer comprising a single layer of an oxide that is chemically inert in an oxidizing environment, said layer of oxide selected from the group consisting of $HfO_2$, $Y_2O_3$-stabilized $ZrO_2$, and combinations thereof;
   removing a portion of the photoresist material corresponding to the portion that was exposed or a portion that was not exposed; and
   modifying the semiconductor wafer where the photoresist material was removed.

9. The method of claim 8, wherein each pair of alternating layers of molybdenum and silicon is about 6.8 nm in thickness, and wherein the capping layer is about 1 nm to about 5 nm in thickness.

* * * * *